(12) United States Patent
Ishizeki et al.

(10) Patent No.: US 8,525,529 B2
(45) Date of Patent: Sep. 3, 2013

(54) IMPEDANCE DETECTION CIRCUIT AND ADJUSTMENT METHOD OF IMPEDANCE DETECTION CIRCUIT

(75) Inventors: Yoshiaki Ishizeki, Kanagawa (JP); Jou Kudou, Kanagawa (JP); Hiroaki Shirai, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 318 days.

(21) Appl. No.: 13/104,601

(22) Filed: May 10, 2011

(65) Prior Publication Data

US 2011/0285407 A1    Nov. 24, 2011

(30) Foreign Application Priority Data

May 21, 2010   (JP) .................................. 2010-117307

(51) Int. Cl.
*G01R 27/26* (2006.01)
(52) U.S. Cl.
USPC ............ 324/659; 324/679; 324/683; 324/705

(58) Field of Classification Search
USPC ................. 324/649, 658, 659, 679, 683, 684, 324/686, 691, 704, 705, 709, 713, 720
See application file for complete search history.

(56) References Cited

FOREIGN PATENT DOCUMENTS

JP         2002-350477        12/2002

*Primary Examiner* — Jermele M Hollington
*Assistant Examiner* — Dustin Dickinson
(74) *Attorney, Agent, or Firm* — Young & Thompson

(57) ABSTRACT

According to the present invention, a small impedance detection circuit capable of accurately detecting the impedance of an object to be measured and an adjustment method of an impedance detection circuit can be provided. In the impedance detection circuit according to the present invention, an AC signal generator outputs an AC signal. A detection circuit, which is connected to a circuit to be measured, applies an AC signal to the circuit to be measured. Further, the detection circuit outputs a first signal corresponding to the composite impedance of the impedance of the circuit to be measured and a parasitic impedance. A correction circuit outputs a second signal in synchronization with the first signal. A subtraction circuit outputs a detection signal obtained by subtracting the second signal from the first signal.

7 Claims, 4 Drawing Sheets

IMPEDANCE DETECTION CIRCUIT AND ADJUSTMENT METHOD OF IMPEDANCE DETECTION CIRCUIT

CROSS-REFERENCE TO RELATED APPLICATIONS

This application is based upon and claims the benefit of priority from Japanese patent application No. 2010-117307, filed on May 21, 2010, the disclosure of which is incorporated herein in its entirety by reference.

BACKGROUND

The present invention relates to an impedance detection circuit that detects an impedance of a circuit connected to a signal line or a similar circuit, and to a method of adjusting a parasitic impedance associated with the impedance detection circuit.

As electronic systems have become more sophisticated in recent years, circuits to detect impedance values such as capacitance sensors have been increasingly used in such electronic systems. Since such impedance detection circuits are installed in various devices, it is desirable that they are small in size and easily adjusted. Further, those impedance detection circuits need to be capable of accurately detecting impedance values regardless of the external environment.

An example of a circuit to detect the impedance of a capacitive element has been proposed (Japanese Unexamined Patent Application Publication No. 2002-350477). FIG. 4 shows a circuit diagram schematically showing a configuration of a capacitance-voltage conversion device (impedance detection circuit) in related art. This impedance detection circuit 300 is explained hereinafter with reference to FIG. 4. The impedance detection circuit 300 operates so that an unknown capacitance $C_s$ of a capacity 30 to be measured is converted into a corresponding voltage (i.e., voltage in proportion to the capacitance $C_s$). This impedance detection circuit 300 is composed of a detection circuit 31, a phase compensation circuit 32, an amplitude compensation circuit 33, a subtraction circuit 34, and an AC (alternating-current) signal generator 35.

The detection circuit 31 detects the capacitance $C_s$ of the capacity 30 to be measured. The detection circuit 31 includes an operational amplifier 41. The operational amplifier 41 is an amplifier whose voltage gain is extremely larger than the closed-loop gain and thereby appears to be almost infinity. A feedback resistor 42 having a resistance value $R_{f1}$ is connected between the output terminal and the inverting input terminal (−) of the operational amplifier 41. In this way, a negative feedback is applied to the operational amplifier 41. A driving signal output from the AC signal generator 35 is applied to the non-inverting input terminal (+) of the operational amplifier 41. The inverting input terminal (−) of the operational amplifier 41 is also connected to one end of the capacity 30 to be measured through a signal line 43. A constant DC (direct-current) bias $V_h$ is applied to the other end of the capacity 30 to be measured.

To prevent any unnecessary signal such as external noises from entering the signal line 43, the signal line 43 is enclosed with a shield line 44. The shield line 44 is not connected to the ground, but is connected to the non inverting input terminal (+) of the operational amplifier 41.

Note that the symbol $C_p$ in FIG. 4 represents a parasitic capacitance occurring in the unshielded part of the signal line 43, i.e., the part of the signal line 43 that is unavoidably exposed. There is a possibility that an AC signal in the surrounding area could be applied to the inverting input terminal (−) of the operational amplifier 41 through this parasitic capacitance $C_p$.

As described above, the negative feedback is applied to the operational amplifier 41 through the feedback resistor 42. Further, the operational amplifier 41 is an amplifier whose voltage gain is extremely larger than the closed-loop gain, and thus the voltage gain appears to be almost infinity. Therefore, both of the input terminals of the operational amplifier 41 are in an imaginary short-circuit state. That is, the voltage difference between the inverting input terminal (−) and the non-inverting input terminal (+) of the operational amplifier 41 is substantially zero. Therefore, the signal line 43 and the shield line 44 are at the same potential (i.e., the same voltage). In this way, it is possible to cancel out the stray capacitance occurring between the signal line 43 and the shield line 44. This feature holds regardless of the length of the signal line 43. Further, it also holds regardless of whether or not the signal line 43 is moved, bent, or folded.

The phase compensation circuit 32 is a circuit that corrects the phase of a driving signal output from the AC signal generator 35. The phase compensation circuit 32 includes an operational amplifier 51. A feedback resistor 52 having a resistance value $R_1$ is connected between the output terminal and the inverting input terminal (−) of the operational amplifier 51. A driving signal output from the AC signal generator 35 is applied to the inverting input terminal (−) of the operational amplifier 51 through a resistor 53 having a resistance value $R_1$. Further, this driving signal is also applied to the non-inverting input terminal (+) of the operational amplifier 51 through a variable resistor 54 having a resistance value $R_{f2}$. The non-inverting input terminal (+) of the operational amplifier 51 is connected to the ground through a capacitor 55 having a capacitance $C_2$.

The amplitude compensation circuit 33 is a circuit to correct the amplitude of the driving signal output from the AC signal generator 35. The amplitude compensation circuit 33 includes an operational amplifier 61. A feedback resistor 62 having a resistance value $R_{f3}$ is connected between the output terminal and the inverting input terminal (−) of the operational amplifier 61. The output voltage of the phase compensation circuit 32, i.e., the output $V_2$ of the operational amplifier 51 is applied to the inverting input terminal (−) of the operational amplifier 61 through a resistor 63 having a resistance value $R_{i3}$. The non-inverting input terminal (+) of the operational amplifier 61 is connected to the ground. Further, the output $V_3$ of the operational amplifier 61 is connected to the inverting input terminal (−) of the operational amplifier 41 through a resistor 45 having a resistance value $R_{i1}$. Note that the current generated by the capacitance $C_s$ and the parasitic capacitance $C_p$ flows toward the feedback resistor 42. In this state, an adjusted current flows from the output of the amplitude compensation circuit 33 into the feedback resistor 42 through the resistor 45 so that the part of the current that is caused by the additional parasitic capacitance $C_p$ is cancelled out.

The subtraction circuit 34 is a circuit to subtract the output of the AC signal generator 35 from the output of the detection circuit 31. The subtraction circuit 34 includes an operational amplifier 71. A feedback resistor 72 having a resistance value $R_1$ is connected between the output terminal and the inverting input terminal (−) of the operational amplifier 71. The output voltage of the detection circuit 31, i.e., the output $V_1$ of the operational amplifier 41 is applied to the inverting input terminal (−) of the operational amplifier 71 through a resistor 73 having a resistance value $R_1$. The output of the AC signal generator 35 is applied to the non-inverting input terminal (+)

of the operational amplifier 71 through a resistor 74 having a resistance value $R_1$. The DC bias $V_h$ is applied to the non-inverting input terminal (+) of the operational amplifier 71 through a resistor 75 having a resistance value $R_1$.

The driving signal output from the AC signal generator 35 is the sum of an AC signal $V_{dv}$ and the DC bias $V_h$. However, the DC bias $V_h$ may be set to zero. The operation of the impedance detection circuit 300 shown in FIG. 4 is explained hereinafter. The signal line 43, which connects the inverting input terminal of the operational amplifier 41 of the detection circuit 31 to one of the electrodes forming the capacity 30 to be measured, is enclosed with and shielded by the shield line 44. However, even when the capacity 30 to be measured is not connected, the phase of the output of the impedance detection circuit 300, i.e., the phase of the output $V_{out}$ of the operational amplifier 71 is shifted from the phase of the AC signal $V_{dv}$, though the amount of the shift is small. This is because the parasitic capacitance $C_p$, which occurs in the part of the signal line 43 that is unavoidably exposed due to the wiring connection and the like, remains.

Therefore, to cancel out the phase shift like this, the phase and the amplitude of the AC signal $V_{dv}$ are adjusted by the phase compensation circuit 32 and the amplitude compensation circuit 33 respectively. In this way, the adjusted signal, i.e., the output $V_3$ of the operational amplifier 61 is fed back to the inverting input terminal of the operational amplifier 41 of the detection circuit 31 through the resistor 45.

In the following explanation, the angular frequency of the AC signal $V_{dv}$ is represented by "$\omega$". The output $V_2$ of the phase compensation circuit 32 is expressed by Equation (1) shown below.

$$V_2 = \frac{1 - j\omega C_2 R_{i2}}{1 + j\omega C_2 R_{i2}} V_{dv} + V_h \tag{1}$$

The output $V_3$ of the amplitude compensation circuit 33 is expressed by Equation (2) shown below.

$$V_3 = -\frac{R_{f3}}{R_{i3}} \frac{1 - j\omega C_2 R_{i2}}{1 + j\omega C_2 R_{i2}} (V_{dv} + V_h) \tag{2}$$

The output $V_1$ of the detection circuit 31 is expressed by Equation (3) shown below.

$$V_1 = j\omega C_s R_{f1} V_{dv} + j\omega C_p R_{f1}(V_{dv} + V_h) + \tag{3}$$
$$\left\{ 1 + \frac{R_{f1}}{R_{i1}} + \frac{R_{f1}}{R_{i1}} \frac{R_{f3}}{R_{i3}} \frac{1 - j\omega C_2 R_{i2}}{1 + j\omega C_2 R_{i2}} \right\} (V_{dv} + V_h)$$

The output $V_{out}$ of the subtraction circuit 34 is expressed by Equation (4) shown below.

$$V_{out} = -j\omega C_s R_{f1} V_{dv} - j\omega C_p R_{f1}(V_{dv} + V_h) - \tag{4}$$
$$\frac{R_{f1}}{R_{i1}} \left\{ 1 + \frac{R_{f3}}{R_{i3}} \frac{1 - j\omega C_2 R_{i2}}{1 + j\omega C_2 R_{i2}} \right\} (V_{dv} + V_h) + V_h$$
$$= -j\omega C_s R_{f1} V_{dv} - (P + Qj) V_{dv} - (P - 1 + Qj) V_h$$

Note that P is expressed by Equation (5) shown below. Q is expressed by Equation (6) shown below.

$$P = \frac{R_{f1}}{R_{i1}} + \frac{R_{f1}}{R_{i1}} \frac{R_{f3}}{R_{i3}} \frac{1 - \omega^2 C_2^2 R_{i2}^2}{1 + \omega^2 C_2^2 R_{i2}^2} \tag{5}$$

$$Q = \omega C_p R_{f1} - \frac{R_{f1}}{R_{i1}} \frac{R_{f3}}{R_{i3}} \frac{2\omega C_2 R_{i2}}{1 + \omega^2 C_2^2 R_{i2}^2} \tag{6}$$

Therefore, the conditions "P=0" and "Q=0" can be achieved by adjusting the resistance value $R_{i2}$ of the variable resistor 54 and the resistance value $R_{i3}$ of the resistor 63 depending on the parasitic capacitance $C_p$. To measure the capacitance $C_s$ of the capacity 30 to be measured, these resistance values $R_{i2}$ and $R_{i3}$ are adjusted before the capacity 30 to be measured is connected to the impedance detection circuit. Under these conditions, the resistance value $R_{i2}$ of the variable resistor 54 is expressed by Equation (7) shown below. The resistance value $R_{i3}$ of the resistor 63 is expressed by Equation (8) shown below.

$$R_{i2} = \frac{1 + \sqrt{1 + \omega^2 C_p^2 R_{i3}^2}}{\omega^2 C_2 C_p R_{i3}} \tag{7}$$

$$R_{f3} = R_{i3} \sqrt{1 + \omega^2 C_p^2 R_{i1}^2} \tag{8}$$

As a result, the output $V_{out}$ of the subtraction circuit 34 is expressed by Equation (9) shown below.

$$V_{out} = -j\omega C_s R_{f1} V_{dv} + V_h \tag{9}$$

Equation (9) indicates that the amplitude of the output $V_{out}$ of the subtraction circuit 34 is in proportion to the capacitance $C_s$ of the capacity 30 to be measured without being affected by the parasitic capacitance $C_p$.

As explained above, in the impedance detection circuit 300 shown in FIG. 4, it is possible to provide an output signal having a value that is not influenced by the parasitic capacitance $C_p$ and is in proportion to the capacitance C, of the capacity 30 to be measured by adjusting the values of two variable resistors.

SUMMARY

However, the present inventors have found a problem that the impedance detection circuit 300 becomes larger in circuit size. In the impedance detection circuit 300, the phase of the signal at the inverting input terminal of the operational amplifier 41 of the detection circuit 31 is delayed from the phase of the original signal input to the non-inverting input terminal due to the influence of the parasitic capacitance. Therefore, a signal having a phase that is advanced with respect to the phase of the original signal is generated and added at the inverting input terminal of the operational amplifier 41 of the detection circuit 31. By doing so, the impedance detection circuit 300 eliminates the influence of the parasitic capacitance.

In the detection circuit 31, the phase is delayed by an amount ranging from 0 to 90 degrees due to the influence of the parasitic capacitance. To cancel out this phase delay, it is necessary to generate a signal whose phase is advanced by 0 to 90 degrees. However, in reality, it is impossible to generate a signal whose phase is advanced. Therefore, a signal whose phase is delayed by 270 to 360 degrees, which is substantially equivalent to a signal whose phase is advanced by 0 to 90 degrees, is generated. However, only a signal whose phase is delayed by an amount ranging from 0 to 180 degrees can be generated with one operational amplifier. Therefore, firstly, the phase is delayed by an amount ranging from 90 to 180 degrees by using the operational amplifier 51 of the phase compensation circuit 32 in the impedance detection circuit 300. Then, a signal whose phase is delayed by 270 to 360 degrees is generated by inverting the output of the operational amplifier 61 of the amplitude compensation circuit 33 (i.e., by delaying the phase by 180 degrees). Therefore, in the related art such as the impedance detection circuit 300, two operational amplifiers are required. As a result, the impedance detection circuit becomes larger in circuit size.

A first aspect of the present invention is an impedance detection circuit including: an AC (alternating-current) signal generator that outputs an AC signal; a detection circuit connected to a circuit to be measured, the detection circuit being configured to output a first signal corresponding to a composite impedance of an impedance of the circuit to be measured and a parasitic impedance parasitic between the detection circuit and the circuit to be measured by applying the AC signal from the AC signal generator to the circuit to be measured; a correction circuit that outputs a second signal according to the AC signal from the AC signal generator, the second signal being in synchronization with the first signal corresponding to the parasitic impedance; and a subtraction circuit that outputs a detection signal obtained by subtracting the second signal from the first signal. The impedance detection circuit according to an aspect of the present invention subtracts the second signal from the first signal. In this way, it is possible to eliminate the influence of the parasitic impedance superimposed on the first signal. Therefore, a detection signal accurately corresponding to the impedance of the circuit to be measured is output.

In accordance with the present invention, it is possible to provide a small impedance detection circuit capable of accurately detecting the impedance of an object to be measured and an adjustment method of an impedance detection circuit.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

[First Embodiment]
Embodiments according to the present invention are explained hereinafter with reference to the drawings. An impedance-voltage conversion circuit (hereinafter called "impedance detection circuit") in accordance with a first embodiment of the present invention outputs a voltage in proportion to the impedance value of a circuit or component to be measured (circuit to be measured). The impedance detection circuit eliminates the influence of a parasitic impedance that would otherwise cause deterioration in the measurement accuracy of the impedance to be measured. Specifically, the impedance detection circuit includes a correction circuit that eliminates the influence of a parasitic impedance.

Figure 1:
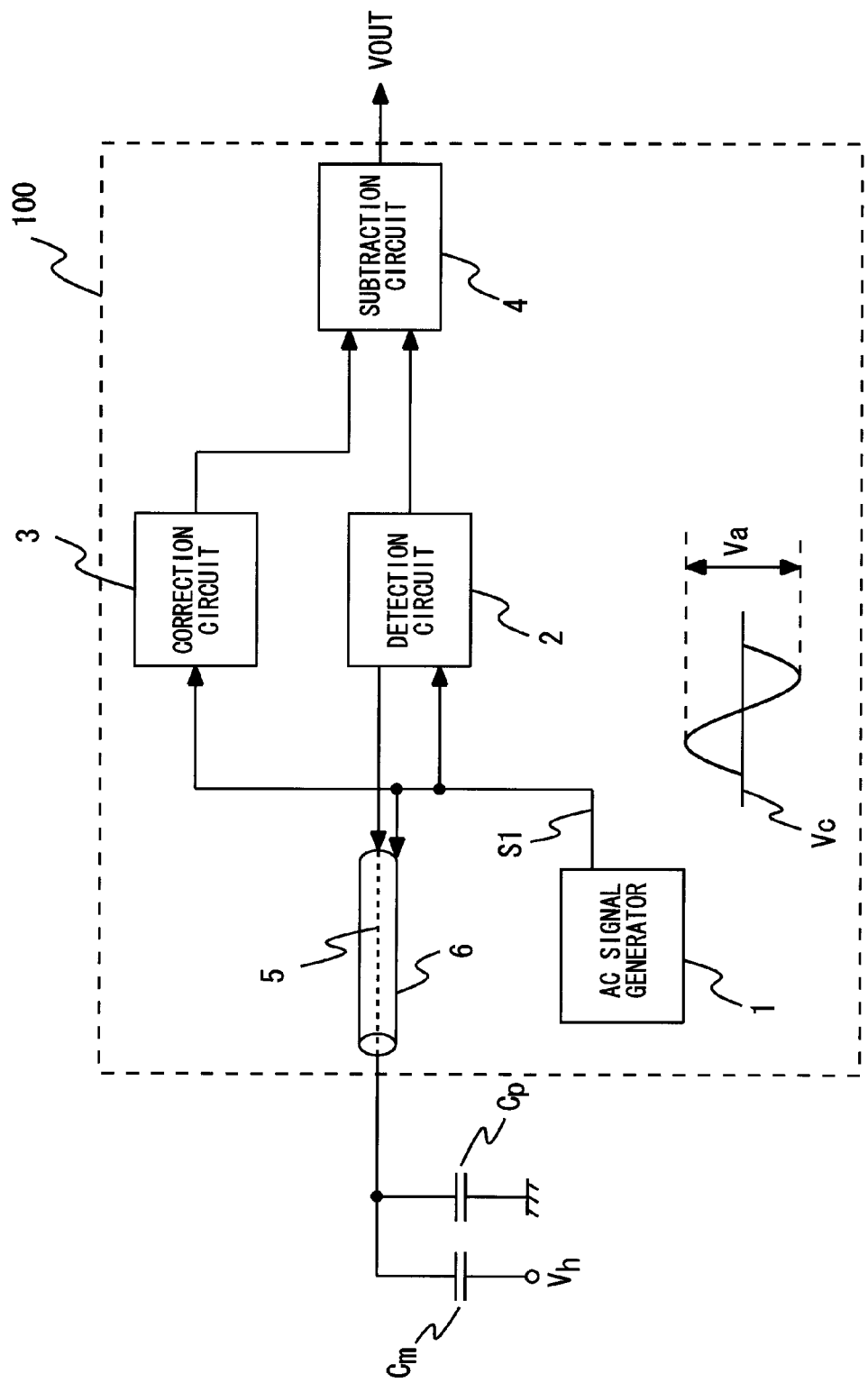
FIG. 1 is a block diagram showing a configuration of an impedance detection circuit (impedance-voltage conversion circuit) 100 according to a first embodiment.
Figure 2:
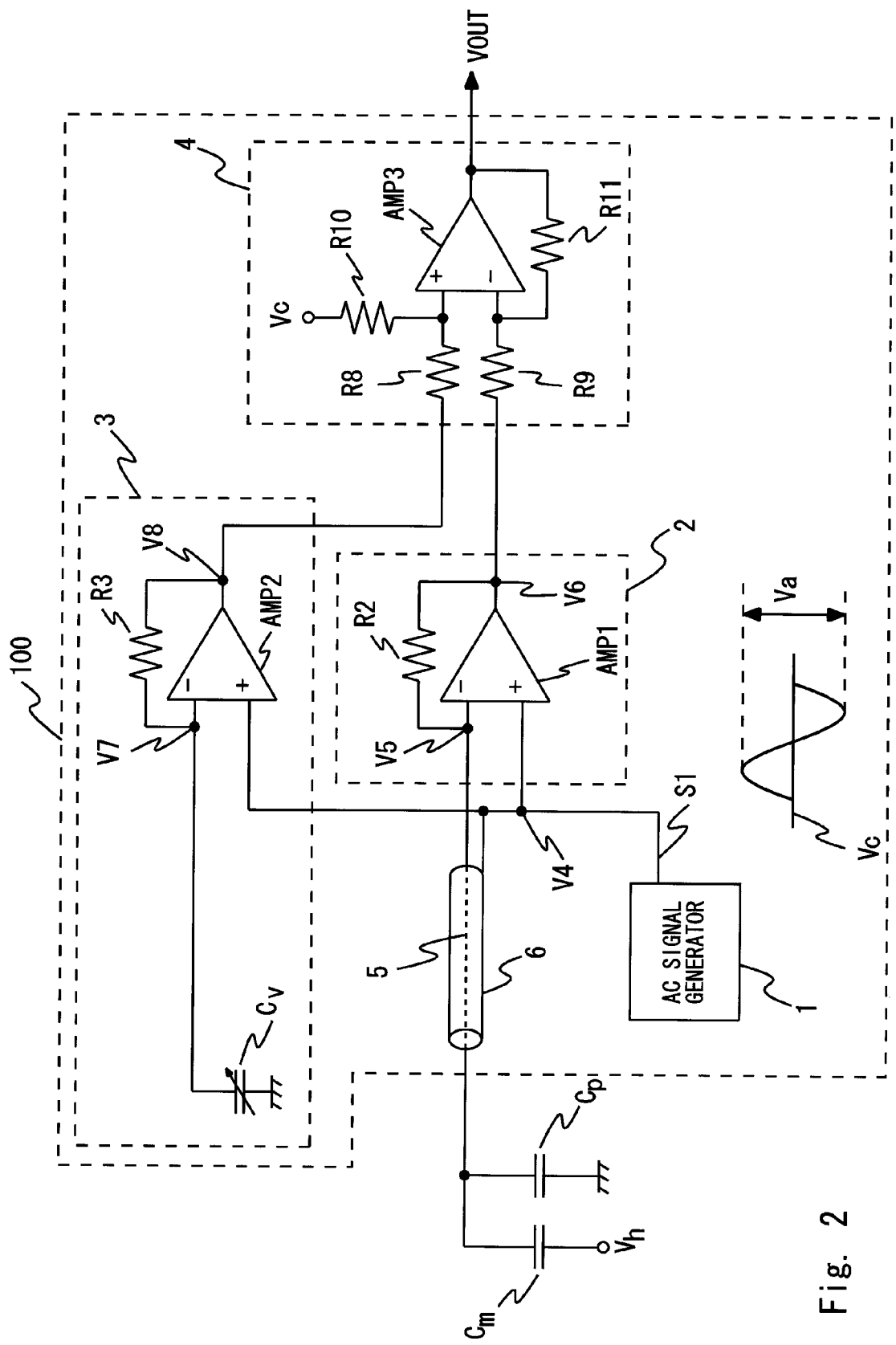
FIG. 2 is a circuit diagram illustrating the configuration of the impedance detection circuit 100 in a more detailed manner.

FIG. 1 is a block diagram showing a configuration of an impedance detection circuit (impedance-voltage conversion circuit) 100 in accordance with a first embodiment of the present invention. FIG. 2 is a circuit diagram illustrating the configuration of the impedance detection circuit 100 in a more detailed manner. The configuration of the impedance detection circuit 100 is explained hereinafter with reference to FIGS. 1 and 2. The impedance detection circuit 100 includes an AC (alternating-current) signal generator 1, a detection circuit 2, a correction circuit 3, a subtraction circuit 4, a signal line 5, and a shield line 6.

The AC signal generator 1 outputs a sine-wave signal 51. The sine-wave signal S1 is a composite signal of an AC signal component Va and the midpoint potential Vc of the sine-wave signal S1.

The detection circuit 2 includes an operational amplifier AMP1 and a feedback resistor R2. The feedback resistor R2 is connected between the inverting input terminal (−) and the output terminal of the operational amplifier AMP1. The inverting input terminal (−) of the operational amplifier AMP1 is also connected to a capacity $C_m$ to be measured through the signal line 5. The non-inverting input terminal (+) of the operational amplifier AMP1 is connected to the AC signal generator 35. Therefore, the sine-wave signal S1, which is the output signal of the AC signal generator 35, is input to the non-inverting input terminal (+) of the operational amplifier AMP1.

The correction circuit 3 includes an operational amplifier AMP2, a feedback resistor R3, and a variable capacity $C_v$. The feedback resistor R3 is connected between the inverting input terminal (−) and the output terminal of the operational amplifier AMP2. The inverting input terminal (−) of the operational amplifier AMP2 is also connected to a ground potential through the variable capacity $C_v$. The non-inverting input terminal (+) of the operational amplifier AMP2 is connected to the AC signal generator 35. Therefore, the sine-wave signal S1, which is the output signal of the AC signal generator 35, is input to the non-inverting input terminal (+) of the operational amplifier AMP2.

The subtraction circuit 4 includes an operational amplifier AMP3, resistors R8 to R10, and a feedback resistor R11. The feedback resistor R11 is connected between the inverting input terminal (−) and the output terminal of the operational amplifier AMP3. The inverting input terminal (−) of the operational amplifier AMP3 is also connected to the output terminal of the operational amplifier AMP1 through the resistor R9. The resistor R10 is connected between the non-inverting input terminal (+) of the operational amplifier AMP3 and the midpoint potential Vc of the sine-wave signal S1. The non-inverting input terminal (+) of the operational amplifier AMP3 is also connected to the output terminal of the operational amplifier AMP2 through the resistor R8.

One end of the capacity $C_m$ to be measured, which is the target to be measured by the impedance detection circuit, is connected to the signal line 5. The other end of the capacity $C_m$ to be measured is connected to a DC (direct-current) bias $V_h$. The DC bias $V_h$ is at the ground potential, at a specific DC voltage, or in a high-impedance state.

The signal line 5 is covered with the shield line 6 to prevent the influence of external noises. Since the inverting input terminal (−) and the non-inverting input terminal (+) of the operational amplifier AMP1 are in an imaginary short-circuit state, a sine-wave signal also flows though the signal line 5.

In the case where the shield line 6 is biased with a DC potential, a parasitic capacitance (parasitic impedance) occurs between the signal line 5 and the shield line 6. To prevent the occurrence of this parasitic capacitance $C_p$, the sine-wave signal S1, which is the output signal of the AC signal generator 35, is supplied to the shield line 6. In this way, it is possible to prevent the parasitic capacitance from occurring between the signal line 5 and the shield line 6.

Further, the parasitic capacitance (parasitic impedance) increases with the increase in the length of the signal line 5. However, the parasitic capacitance depending on the length of the signal line 5 can be ignored as long as the signal line 5 is covered with the shield line 6. However, a part of the wiring line between the signal line 5 and the capacity $C_m$ to be measured is not covered by the shield line 6, in which the wiring of the signal line 5 is exposed. A parasitic capacitance (parasitic impedance) $C_p$ is parasitic on this exposed portion. In FIGS. 1 and 2, this parasitic capacitance $C_p$ is represented as a capacitive element.

Next, an operation of the impedance detection circuit 100 is explained. The impedance detection circuit 100 subtracts the influence of the parasitic capacitance $C_p$ reproduced by the correction circuit 3 from the detection result by the detection circuit 2. In this way, the impedance detection circuit 100 operates so as to output an output voltage in proportion to the capacitance value of the capacity $C_m$ to be measured.

As described above, the sine-wave signal S1 output from the AC signal generator 35 is the composite signal of the AC signal component Va and the midpoint potential Vc of the AC signal amplitude. No charge/discharge current based on the DC voltage level flows to/from the capacity $C_m$ to be measured. That is, the DC voltage level has no substantial effect on the capacitance detection of the capacity $C_m$ to be measured. Therefore, to detect the capacitance value of the capacity $C_m$ to be measured, attention should be directed only to the AC signal component Va of the sine-wave signal S1. In the following explanation, an operation of the impedance detection circuit 100 is explained while directing attention to the AC signal component Va.

In the explanation, the angular frequency of the AC signal component Va is represented by "ω". The node potential at the non-inverting input terminal (+) of the operational amplifier AMP1 of the detection circuit 2 is represented by "V4". The node potential at the inverting input terminal (−) of the operational amplifier AMP1 is represented by "V5". The potential at the output terminal of the operational amplifier AMP1 is represented by "V6". The node potential at the inverting input terminal (−) of the operational amplifier AMP2 of the correction circuit 3 is represented by "V7". The potential at the output terminal of the operational amplifier AMP2 is represented by "V8". Assume that the DC bias $V_h$ of the capacity $C_m$ to be measured is at the ground potential.

In the detection circuit 2, the output terminal and the inverting input terminal (−) of the operational amplifier AMP1 are closed in a closed loop. Therefore, the inverting input terminal (−) and the non-inverting input terminal (+) of the operational amplifier AMP1 are in an imaginary short-circuit state. In this state, the AC signal component Va is input to the non-inverting input terminal (+) of the operational amplifier AMP1. Therefore, the inverting input terminal (−) of the operational amplifier AMP1 is put in such a state that the AC signal component Va is being applied to the inverting input terminal (−).

Therefore, the AC signal component Va is applied to the capacity $C_m$ to be measured and the parasitic capacitance $C_p$.

Letting $R_{sp}$ stand for the composite impedance of the capacity $C_m$ to be measured and the parasitic capacitance $C_p$, the composite impedance $R_{sp}$ is expressed by Equation (10) shown below.

$$Rsp = -\frac{1}{j\omega C_m + j\omega C_p} \quad (10)$$

Letting i1 stand for the current flowing to the capacity $C_m$ to be measured and the parasitic capacitance $C_p$, the node potential V5 is expressed by Equation (11) shown below.

$$V5 = -\frac{1}{j\omega C_m + j\omega C_p} \cdot i1 \quad (11)$$

By transforming Equation (11) while paying attention to the current i1, Equation (12) shown below is obtained.

$$i1 = (j\omega C_m + j\omega C_p) \cdot V5 \quad (12)$$

The current i1 also flows to the feedback resistor R2 of the detection circuit 2. Therefore, according to Ohm's law, the difference voltage across the feedback resistor R2, i.e., between the node potential V6 and the node potential V5 is expressed by Equation (13) shown below.

$$V6 - V5 = (j\omega C_m + j\omega C_p) \cdot V5 \cdot R2 \quad (13)$$

As a result, the node potential V6 is expressed by Equation (14) shown below.

$$V6 = (j\omega C_m R2 + j\omega C_p R2 + 1) \cdot V5 \quad (14)$$

Similarly, in the correction circuit 3, the output terminal and the inverting input terminal (−) of the operational amplifier AMP2 are closed in a closed loop. Therefore, the inverting input terminal (−) and the non-inverting input terminal (+) of the operational amplifier AMP2 are in an imaginary short-circuit state. In this state, the AC signal component Va is input to the non-inverting input terminal (+) of the operational amplifier AMP2. Therefore, the inverting input terminal (−) of the operational amplifier AMP2 is put in such a state that the AC signal component Va is being applied to the inverting input terminal (−).

Letting i2 stand for the current flowing to the variable capacity $C_v$ of the correction circuit 3, the node potential V7 is expressed by Equation (15) shown below.

$$V7 = \frac{1}{j\omega C_v} \cdot i2 \quad (15)$$

By transforming Equation (15) while paying attention to the current i2, Equation (16) shown below is obtained.

$$i2 = j\omega C_v V7 \quad (16)$$

The current i2 also flows to the feedback resistor R3 of the correction circuit 3. Therefore, according to Ohm's law, the difference voltage across the feedback resistor R3, i.e., between the node potential V8 and the node potential V7 is expressed by Equation (17) shown below.

$$V8 - V7 = j\omega C_v V7 \cdot R3 \quad (17)$$

As a result, the node potential V8 is expressed by Equation (18) shown below.

$$V8 = (j\omega C_v R3 + 1) \cdot V7 \quad (18)$$

The node potential V6 and the node potential V8 are applied to the subtraction circuit 34. Further, a subtraction result between the node potentials V6 and V8 becomes the detection signal VOUT. That is, the relation "(Detection signal VOUT)=(Node potential V6)−(Node potential V8)" is satisfied. Therefore, by substituting Equation (18) into Equation (14), the detection signal VOUT is expressed by Equation (19) shown below.

$$VOUT = (j\omega C_m R2 + j\omega C_p R2 + 1) \cdot V5 - (j\omega C_v R3 + 1) \cdot V7 \quad (19)$$

In consideration of the relation of the imaginary short-circuit, the relation "(AC signal component Va)=(Node potential V4)=(Node potential V5)=(Node potential V7)" is satisfied. Further, assuming that (Feedback resistance R2)=(Feedback resistance R3) and (Parasitic capacitance $C_p$)=(Variable capacitance $C_v$), Equation (19) is expressed by Equation (20) shown below.

$$VOUT = (j\omega C_m R2) \cdot Va \quad (20)$$

That is, assuming that (Feedback resistance R2)=(Feedback resistance R3) and (Variable capacitance $C_v$)=(Parasitic capacitance $C_p$), the detection signal VOUT does not depend on the value of the parasitic capacitance $C_p$. Therefore, the detection signal VOUT has a value in proportion to the capacity $C_m$ to be measured. Accordingly, the impedance detection circuit 100 can obtain an output voltage in proportion to the capacitance value of the capacity $C_m$ to be measured without being affected by the parasitic capacitance $C_p$. Note that, needless to say, the impedance detection circuit 100 can also detect a resistance value as well as the capacitance value.

A way of achieving the relation "(Variable capacitance $C_v$)=(Parasitic capacitance $C_p$)" in the impedance detection circuit 100 is explained hereinafter. Firstly, the impedance detection circuit 100 is operated in a state where no capacity $C_m$ to be measured is connected to the impedance detection circuit 100. In this state, only the parasitic capacitance $C_p$ has an effect on the impedance detection circuit 100. In this state, the variable capacity $C_v$ of the correction circuit 3 is adjusted so that the node potential V6 and the node potential V8 are equal to each other. The decision whether or not the node potential V6 and the node potential V8 become equal to each other is made by monitoring the detection signal VOUT of the subtraction circuit 4. By adjusting the detection signal VOUT into a state where the detection signal VOUT contains only a DC component without containing any AC signal component, the relation "(Variable capacitance $C_v$)=(Parasitic capacitance $C_p$)" can be achieved. After that, the impedance detection circuit 100 is operated in a state a capacity $C_m$ to be measured is connected to the impedance detection circuit 100, so that the impedance detection circuit 100 can accurately measure the capacitance value of the capacity $C_m$ to be measured without being affected by the parasitic capacitance $C_p$.

That is, the impedance detection circuit 100 includes the correction circuit 3, which is a replica circuit of the detection circuit 2. That is, the correction circuit 3 reproduces the influence of the parasitic capacitance $C_p$ associated with the detection circuit 2. Further, the output signal of the correction circuit 3 is subtracted from the output signal of the detection circuit 2. The output signal (node potential V8) output from the correction circuit 3 is in synchronization with the output signal (node potential V6) from the detection circuit 2. As a result, the influence of the parasitic capacitance $C_p$ is eliminated from the detection signal VOUT output from the subtraction circuit 4. In this way, the impedance detection circuit 100 can accurately measure the impedance associated with the capacity $C_m$ to be measured.

Figure 4:
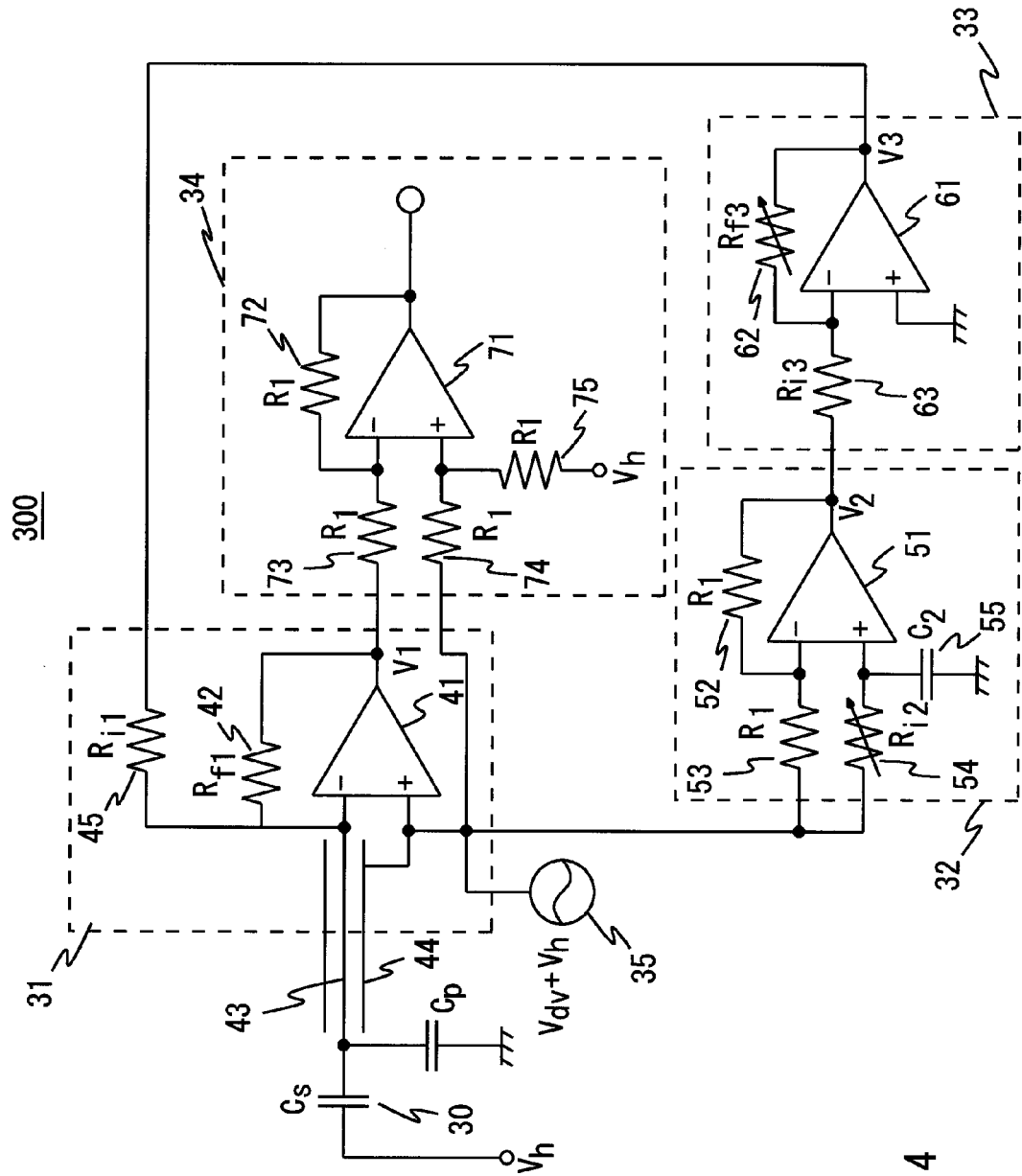
FIG. 4 is a circuit diagram schematically showing a configuration of a capacitance-voltage conversion circuit (impedance detection circuit) in related art.

Further, according to this configuration, the size of the impedance detection circuit can be reduced. In the impedance detection circuit 100, the correction circuit 3 includes only one operational amplifier. Therefore, the impedance detection circuit 100 includes only one operational amplifier except for ones in the detection circuit 2 and the subtraction circuit 4. In contrast to this, in the impedance detection circuit 300 shown in FIG. 4, each of the phase compensation circuit 32 and the amplitude compensation circuit 33 includes one operational amplifier. Therefore, the impedance detection circuit 300 includes two operational amplifiers except for ones in the detection circuit 31 and the subtraction circuit 34. In general, an operational amplifier requires a large circuit configuration. Therefore, according to the impedance detection circuit 100, it is possible to realize a small impedance detection circuit.

In general, an operational amplifier includes a part in which a current flows constantly. Therefore, the power consumption increases with the increase in the number of installed operational amplifiers. However, as described above, the impedance detection circuit 100 can reduce the number of the installed operational amplifiers. Therefore, according to the impedance detection circuit 100, it is possible to lower the power consumption.

In addition, in the impedance detection circuit 100, the number of components required in the correction circuit 3 is smaller compared to that of the configuration of the related art such as the impedance detection circuit 300. Therefore, it is possible to realize an impedance detection circuit at a lower cost.

Further, according to this configuration, accurate impedance detection can be easily made just by adjusting the capacitance value of one variable capacity. Further, all you have to do is to adjust only one variable capacity, the adjustment task can be easily performed in a short time. Therefore, it is possible to reduce the cost required for the impedance detection task.

[Second Embodiment]

Figure 3:
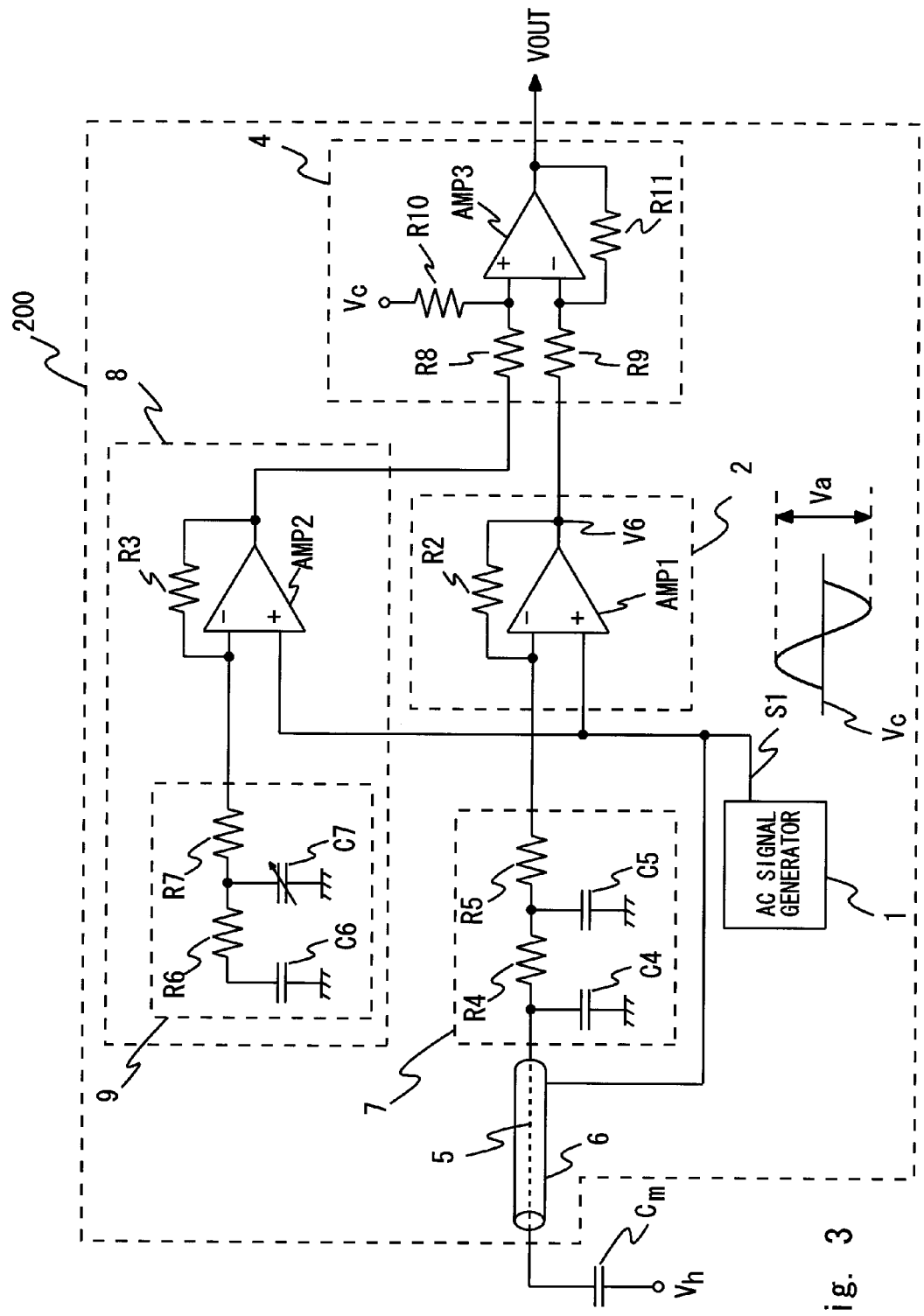
FIG. 3 is a circuit diagram showing a configuration of an impedance detection circuit 200 according to a second embodiment.

Next, an impedance detection circuit in accordance with a second embodiment of the present invention is explained. FIG. 3 is a circuit diagram showing a configuration of an impedance detection circuit 200 in accordance with a second embodiment of the present invention. Firstly, the configuration of the impedance detection circuit 200 is explained hereinafter with reference to FIG. 3. In comparison to the impedance detection circuit 100, the impedance detection circuit 200 includes a filter circuit 7 interposed between the detection circuit 2 and a capacity $C_m$ to be measured. With the interposition of the filter circuit 7, the parasitic capacitance $C_p$ becomes relatively smaller, and therefore its direct influence does not appear any more. That is, in the impedance detection circuit 200, the parasitic capacitance $C_p$ is sufficiently small and it does not have any influence on the impedance detection circuit 200. Further, in the impedance detection circuit 200, the correction circuit 3 of the impedance detection circuit 100 is replaced by a correction circuit 8. The other configuration of the impedance detection circuit 200 is similar to that of the impedance detection circuit 100, and therefore its explanation is omitted here.

The filter circuit 7 includes capacities C4 and C5 and resistors R4 and R5. One end of the resistor R5 is connected to the inverting input terminal (−) of the operational amplifier AMP1 of the detection circuit 2. The other end of the resistor R5 is connected to one end of the resistor R4. The other end of the resistor R4 is connected to the signal line 5. The capacity C5 is connected between the node between the resistors R4 and R5, and a ground potential. The capacity C4 is connected between the node between the resistor R4 and the signal line 5, and the ground potential.

The correction circuit 8 has a configuration obtained by replacing the variable capacity $C_v$ of the correction circuit 3 shown in FIG. 2 with a correction filter circuit 9. The correction filter circuit 9 includes a capacity C6, a variable capacity C7, and resistors R6 and R7. One end of the resistor R7 is connected to the inverting input terminal (−) of the operational amplifier AMP2. The other end of the resistor R7 is connected to one end of the resistor R6. The other end of the resistor R6 is connected to the ground potential through the capacity C6. The variable capacity C7 is connected between the node between the resistors R6 and R7, and the ground potential.

In the impedance detection circuit 200, the electrode for measuring a capacity $C_m$ to be measured as well as a part of the signal line 5 that is not covered by the shield line 6 are susceptible to noises. However, it is desirable to accurately measure the capacitance value of a capacity $C_m$ to be measured even in environments in which the measurement is susceptible to external noises. Therefore, in the impedance detection circuit 200, the filter circuit 7 is interposed in order to suppress the influence of noises.

However, when the filter circuit 7 is interposed, the impedance of the filter circuit 7 is added to the impedance of the capacity $C_m$ to be measured and the combined impedance is thereby measured. Accordingly, in order to accurately measure the impedance of the capacity $C_m$ to be measured, it is necessary to eliminate the influence of the filter circuit 7. To that end, the correction filter circuit 9, which has a similar configuration to that of the filter circuit 7, is provided in the correction circuit 8. In this way, the influence of the impedance of the filter circuit 7 is eliminated.

In other words, the impedance of the filter circuit 7 corresponds to the impedance of the parasitic capacitance $C_p$ shown in FIG. 2. Therefore, it can be easily understood that, similarly to the impedance detection circuit 100, the influence of the impedance of the filter circuit 7 can be also cancelled out by the correction circuit 8 in the impedance detection circuit 200.

Therefore, according to the impedance detection circuit 200, the impedance of the capacity $C_m$ to be measured can be accurately measured even in the case where a filter circuit for suppressing the influence of noises or the like is incorporated. That is, according to the impedance detection circuit 200, it is possible to eliminate the impedance that is added to the signal line due to any causes other than the object to be measured and thereby to accurately measure the impedance of the object to be measured.

According to this configuration, the influence of the parasitic capacitance can be suppressed by the filter circuit 7. Therefore, the adjustment of the variable capacity, which is necessary in the impedance detection circuit 100, can be omitted. As a result, the time required for the impedance detection task can be reduced even further.

Note that the present invention is not limited to the above-described embodiments, and various modifications can be made without departing from the spirit of the present invention. For example, the configurations of the detection circuit and the correction circuit shown above are merely examples. Therefore, any other configurations can be used for the detection circuit and the correction circuit, provided that they can eliminate the influence of the parasitic capacitance $C_p$ by subtracting the output signal of the correction circuit from the output signal of the detection circuit.

The first and second embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. An impedance detection circuit comprising:
an AC signal generator that outputs an AC signal;
a detection circuit connected to a circuit to be measured, the detection circuit being configured to output a first signal corresponding to a composite impedance of an impedance of the circuit to be measured and a parasitic impedance parasitic between the detection circuit and the circuit to be measured by applying the AC signal from the AC signal generator to the circuit to be measured;
a correction circuit that outputs a second signal according to the AC signal from the AC signal generator, the second signal being in synchronization with the first signal corresponding to the composite impedance; and
a subtraction circuit that outputs a detection signal obtained by subtracting the second signal from the first signal.

2. The impedance detection circuit according to claim 1, wherein
the detection circuit comprises:
a first operational amplifier, a non-inverting input terminal of the first operational amplifier being connected to an output terminal of the AC signal generator, an inverting input terminal of the first operational amplifier being connected to a fixed potential, and an output terminal of the first operational amplifier being connected to the subtraction circuit; and
a first resistive element connected between the output terminal and the inverting input terminal of the first operational amplifier, and
the correction circuit comprises:
a second operational amplifier, a non-inverting input terminal of the second operational amplifier being connected to the output terminal of the AC signal generator, and an output terminal of the second operational amplifier being connected to the subtraction circuit;
a second resistive element connected between the output terminal and an inverting input terminal of the second operational amplifier; and
a variable capacitive element connected between the inverting input terminal of the second operational amplifier and a ground potential.

3. The impedance detection circuit according to claim 2, wherein
the first operational amplifier has a same amplification characteristic as that of the second operational amplifier, and
the first resistive element has a same resistance value as that of the second resistive element.

4. The impedance detection circuit according to claim 2, further comprising:
a signal line that connects the inverting input terminal of the first operational amplifier to the circuit to be measured; and
a shield line connected to the non-inverting input terminal of the first operational amplifier and the non-inverting input terminal of the second operational amplifier, the shield line being configured to shield the signal line, wherein a part of the signal line is not shielded by the shield line.

5. The impedance detection circuit according to claim 4, further comprising a filter circuit interposed in the part of the signal line that is not shielded by the shield line, wherein the filter circuit comprises:
a third resistive element, one end of the third resistive element being connected to the inverting input terminal of the first operational amplifier;
a fourth resistive element connected between an another end of the third resistive element and the circuit to be measured;
a first capacitive element connected between a connection point between the third and fourth resistive elements, and a ground potential; and
a second capacitive element connected between the circuit to be measured and the fourth resistive element, and wherein the correction circuit comprises:
a fifth resistive element connected between the variable capacitive element and the inverting input terminal of the second operational amplifier;
a sixth resistive element, one end of the sixth resistive element being connected to one end on the second operational amplifier side of the variable capacitive element; and
a third capacitive element connected between another end of the sixth resistive element and a ground potential.

6. The impedance detection circuit according to claim 5, wherein the third to sixth resistive elements have a same resistance value as each other, and the first to third capacitive elements have a same capacitance value as each other.

7. An adjustment method of an impedance detection circuit according to claim 1 comprising:

in a state where the circuit to be measured is not connected to the impedance detection circuit, outputting the AC signal from the AC signal generator; and adjusting a capacitance value of the variable capacitive element and thereby making the first signal and the second signal equal to each other.

* * * * *